(12) United States Patent
Kato et al.

(10) Patent No.: US 6,773,858 B2
(45) Date of Patent: Aug. 10, 2004

(54) POSITIVE PHOTORESIST COMPOSITION

(75) Inventors: Hideto Kato, Gunma-ken (JP); Kyoko Soga, Gunma-ken (JP); Tomoyoshi Furihata, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/635,032

(22) Filed: Aug. 6, 2003

(65) Prior Publication Data

US 2004/0029032 A1 Feb. 12, 2004

(30) Foreign Application Priority Data

Aug. 6, 2002 (JP) ....................................... 2002-228423

(51) Int. Cl.$^7$ ............................................... G03F 7/023
(52) U.S. Cl. ........................ 430/190; 430/165; 430/191; 430/192; 430/193
(58) Field of Search ................................ 430/165, 190, 430/191, 192, 193

(56) References Cited

U.S. PATENT DOCUMENTS

| 3,708,305 | A |   | 1/1973  | Koyanagi et al. | ........ 430/281.1 |
| 3,802,885 | A |   | 4/1974  | Lawson et al.   | ............. 430/165 |
| 4,174,222 | A | * | 11/1979 | Komine et al.   | ............. 430/190 |
| 4,177,073 | A |   | 12/1979 | Hata et al.     | ................... 430/188 |
| 5,422,221 | A | * | 6/1995  | Okazaki et al.  | ............. 430/190 |
| 6,218,069 | B1 | * | 4/2001 | Kato et al.     | ................... 430/190 |
| 6,242,151 | B1 | * | 6/2001 | Furihata et al. | ............. 430/190 |
| 2003/0059706 | A1 |   | 3/2003 | Misumi et al. | ............. 430/190 |

FOREIGN PATENT DOCUMENTS

| EP | 1 102 123 A1 | 5/2001 |
| GB | 1 243 963 | 8/1971 |
| JP | 63-287951 A | 11/1988 |

OTHER PUBLICATIONS

Komano, Hiroshi, Surface Technology, vol. 44, No. 6, pp. 490–494, (1993).

* cited by examiner

*Primary Examiner*—John S. Chu
(74) *Attorney, Agent, or Firm*—Birch, Stewart, Kolasch & Birch, LLP

(57) ABSTRACT

A photoresist composition comprising a novolac resin in which 3-27 mol % of the hydroxyl group hydrogens are substituted with 1,2-naphthoquinonediazidosulfonyl groups and an alkali-soluble cellulose whose glucose ring substituent groups are substituted with organic groups at a specific rate is used in microprocessing as a positive photoresist and offers many advantages including uniformity, high sensitivity, high resolution, good pattern shape, heat resistance, film retention, substrate adhesion, shelf stability, and high throughput.

2 Claims, No Drawings

POSITIVE PHOTORESIST COMPOSITION

This invention relates to a positive photoresist composition comprising a polymer in the form of a novolac resin in which some hydroxyl group hydrogens are substituted with 1,2-naphthoquinonediazidosulfonyl groups.

BACKGROUND OF THE INVENTION

The recent down-sizing trend of electronic equipment promotes the development of LSIs with higher integration, for which multi-pin thin layer bonding is widely employed. In the multi-pin structure, bumps are requisite as connection terminals. Photoresist materials are employed in forming bumps on LSIs by a plating process.

As a result of an increased number of pins and a reduced pin spacing toward higher density on LSI, the shape of bumps formed using thick film resist is required to be perpendicular (or have straight sidewalls). The photoresist for use in the plating process has to meet requirements including thick-film performance, high sensitivity, shape perpendicularity, high resolution, plating resistance, and complete stripping.

However, prior art resist materials are difficult to meet the above requirements. Several problems arise when a positive photoresist comprising a novolac resin and 1,2-naphthoquinonediazidosulfonate as used in the conventional LSI manufacture is used in the thick film technology without modification. An increase in film thickness increases the relative amount of naphthoquinonediazido to enhance absorption, incurring a noticeable lowering of sensitivity. Also, on account of the light absorption of a photosensitive agent, a difference in exposure energy occurs between the surface layer and the bottom of resist, exacerbating the shape and resolution (aspect ratio). In addition, the resist will crack because it cannot withstand the stress of metal growth during the plating.

To overcome these drawbacks, a resist having added an acrylate copolymer having flexibility was developed (see Surface Technology, vol. 44, page 490, 1993). To comply with electronic devices of higher density, resists are required to have a higher resolution. With respect to the in-plane film thickness distribution, there is a concern about the degradation of uniformity in a coating plane as a result of thick film. There is an increasing demand for the uniformity of in-plane film thickness distribution. It is also expected that the thick film gives rise to problems like a lowering of throughput in the device manufacturing process and a shortage of developing power of prior art developers. However, it was difficult to develop a photoresist that satisfies all of the foregoing requirements.

SUMMARY OF THE INVENTION

An object of the invention is to provide a positive photoresist composition which when used in thick film pattern formation, has the advantages of uniformity, high sensitivity, high resolution, good pattern shape, substrate adhesion, film retention, shelf stability, high throughput and resistance to metal growth stress.

It has been found that the above-mentioned problems are solved by using an alkali-soluble cellulose whose glucose ring substituent groups are substituted with organic groups at a specific rate of reaction, as a binder in a photoresist composition.

According to the invention, there is provided a positive photoresist composition comprising (A) a polymer and (B) an alkali-soluble cellulose resin. The polymer (A) is in the form of a novolac resin comprising recurring units of the structure represented by the general formula (1):

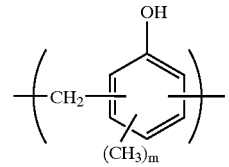

wherein m is an integer of 1 to 3, and having a weight average molecular weight of 1,000 to 30,000 based on polystyrene standards and in which 3 to 27 mol % of the hydroxyl group hydrogens on the novolac resin are substituted with 1,2-naphthoquinonediazidosulfonyl groups. The alkali-soluble cellulose resin (B) is represented by the general formula (2):

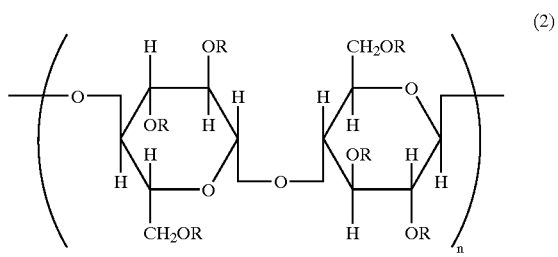

wherein R is independently a hydrogen atom, an alkyl group of 1 to 6 carbon atoms, a hydroxyalkyl group of 1 to 6 carbon atoms, an acyl group of 2 to 15 carbon atoms or an organic group of the structural formula (3):

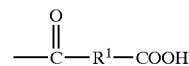

wherein $R^1$ is an alkylene group of 1 to 6 carbon atoms, phenylene group or cyclohexylene group, in a range providing an acid value of 30 to 150, the proportion of the organic group of formula (3) in R being on average 2 to 30 mol % per unit glucose ring, and n is an integer of 2 to 10,000.

DESCRIPTION OF THE PREFERRED EMBODIMENTS

Component (A) in the positive photoresist composition of the invention is a polymer in the form of a novolac resin comprising recurring units of the structure represented by the general formula (1):

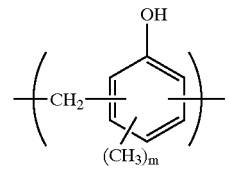

wherein m is an integer of 1 to 3, and having an average molecular weight of 1,000 to 30,000 based on polystyrene standards and in which 3 to 27 mol % of the hydroxyl group hydrogens on the novolac resin are substituted with 1,2-naphthoquinonediazidosulfonyl groups.

The novolac resin should have a weight average molecular weight of 1,000 to 30,000, preferably 3,000 to 20,000, more preferably 3,000 to 10,000, as determined on a basis of polystyrene standards. A weight average molecular weight of less than 1,000 may lead to poor film retention and heat resistance after development whereas a weight average molecular weight of more than 30,000 may adversely affect the resolution and sensitivity of resists.

On the novolac resin, 3 to 27 mol % of the hydrogen atoms of hydroxyl groups are substituted with 1,2-naphthoquinonediazidosulfonyl groups. The preferred proportion of substitution is in a range of 3 to 20 mol %.

One typical method of substituting 1,2-naphthoquinonediazidosulfonyl groups for hydrogen atoms of hydroxyl groups on a novolac resin is the reaction of a novolac resin with 1,2-naphthoquinonediazidosulfonyl chloride. Suitable reaction conditions may be determined without undue experimentation. The reaction is often conducted at 5 to 50° C. for about 15 hours in the presence of a solvent such as 1,4-dioxane, acetone, methyl ethyl ketone or methyl isobutyl ketone.

Component (B) is an alkali-soluble cellulose resin represented by the general formula (2):

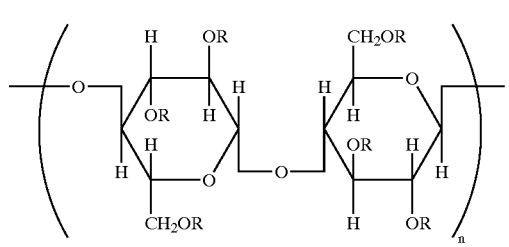

(2)

wherein R is independently a hydrogen atom, an alkyl group of 1 to 6 carbon atoms, a hydroxyalkyl group of 1 to 6 carbon atoms, an acyl group of 2 to 15 carbon atoms or an organic group of the structural formula (3):

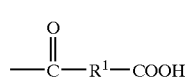

(3)

wherein $R^1$ is an alkylene group of 1 to 6 carbon atoms, phenylene group or cyclohexylene group, in a range providing an acid value of 30 to 150, the proportion of the organic group of formula (3) in R being on average 2 to 30 mol % per unit glucose ring, and n is an integer of 2 to 10,000. This alkali-soluble cellulose resin itself is hydrophobic and acid resistant because the carboxyalkyl groups introduced do not dissociate under weakly acidic conditions, but can be removed in an aqueous alkaline liquid because the carboxyalkyl groups dissociate in a weakly acidic to neutral region, and thus becomes a resin binder transparent to an exposure light source.

As long as the cellulose resin has an acid value of 30 to 150, R is independently selected from among hydrogen, an alkyl group of 1 to 6 carbon atoms, a hydroxyalkyl group of 1 to 6 carbon atoms, an acyl group of 2 to 15 carbon atoms and an organic group of the structural formula (3), and the proportion of the organic group of formula (3) in R is on average 2 to 30 mol % per unit glucose ring.

Examples of R include hydrogen, alkyl groups of 1 to 6 carbon atoms such as methyl, ethyl, butyl and isobutyl, hydroxyalkyl groups of 1 to 6 carbon atoms such as hydroxymethyl, hydroxyethyl, hydroxybutyl and hydroxyisobutyl, and an acyl group of 2 to 15 carbon atoms such as acetyl, propionyl and benzoyl. Of these, alkyl groups of 1 to 4 carbon atoms and hydroxyalkyl groups of 1 to 4 carbon atoms are preferred.

In formula (3), $R^1$ is an alkylene group of 1 to 6 carbon atoms, such as ethylene, a phenylene group or a cyclohexylene group.

The proportion of the organic group of formula (3) in R is on average 2 to 30 mol %, preferably 5 to 25 mol %, per unit glucose ring. If the proportion of the organic group of formula (3) is less than 2 mol %, the resin becomes less dissolvable in an alkali solution upon development. If the proportion of the organic group of formula (3) is more than 30 mol %, the resin becomes too much dissolvable in an alkali solution, which becomes the cause of film slimming after development.

Examples of the cellulose resin which can meet these conditions include resins having hydroxypropyl and carboxybutyl groups, resins having hydroxypropyl and carboxybenzoyl groups, and resins having hydroxypropyl and carboxyphenyl groups, such as, for example, hydroxypropyl methyl cellulose phthalate (trade name HPMCP), hydroxypropyl methyl cellulose acetate phthalate (trade name HPMCAP) and hydroxypropyl methyl cellulose hexahydrophthalate (trade name HPMCHHP, all by Shin-Etsu Chemical Co., Ltd.).

The degree of substitution can be determined by the measuring method by gas chromatography described in methyl cellulose item of the Japan's Specifications and Standards for Food Additives and the method of measuring the degree of substitution on methyl cellulose and hydroxypropyl methyl cellulose prescribed in the Pharmacopoeia of Japan.

The subscript n is an integer of 2 to 10,000, preferably 100 to 10,000.

The preferred amount of the alkali-soluble cellulose resin (B) blended is 10 to 30 parts by weight, more preferably 10 to 25 parts by weight, per 100 parts by weight of the polymer (A). With less than 10 parts of the cellulose resin, the resist may fail to withstand the stress of metal growth during the plating after thick-film resist pattern formation, so that the pattern may crack. With more than 30 parts of the cellulose resin, the solubility of the composition in an aqueous alkaline solution may increase at the expense of adhesion of the composition to substrates.

On use, the positive photoresist composition of the invention is dissolved in an organic solvent. Any organic solvents in which the alkali-soluble cellulose resin is soluble may be used, for example, acetone, ethyl lactate and butyl acetate. Such organic solvents may be used alone or in admixture. The amount of the organic solvent used is preferably 50 to 2,000 parts by weight, more preferably 100 to 1,000 parts by weight, per 100 parts by weight of total solids. Less than 50 parts of the solvent leads to an increased viscosity, difficulty of coating, ineffective operation and insufficient compatibility of the respective components. More than 2,000 parts of the solvent may offer no further change in compatibility and lead to a too low viscosity to provide a necessary composition coating thickness.

Beside the above-mentioned components, the inventive photoresist composition may contain a surfactant which is commonly used for improving the coating characteristics as long as the objects of the invention are not impaired. Non-ionic surfactants are preferred, for example, Florade FC-430 by Sumitomo-3M Co., Ltd. and X-70-092 and X-70-093 by Shin-Etsu Chemical Co., Ltd.

In the positive photoresist composition of the invention, other additives such as naphthoquinone sulfonate and dyes may be added in small amounts for the purposes of improving sensitivity and prohibiting film slimming and swelling upon development or the like.

The resist composition of the invention is coated onto a silicon wafer or a substrate having a metal film formed thereon by sputtering or plating, and prebaked at about 80 to 130° C. for about 50 to 600 seconds to form a resist film of about 5 to 50 µm thick. The resist film is exposed to light and developed with a developer such as an aqueous solution of tetramethylammonium hydroxide or KOH to form a pattern. After the development, post-baking may be done at about 50 to 100° C. for about 10 to 600 seconds. The substrate on which the pattern has been formed is subjected to ashing by oxygen plasma for removing minute resist residues on the pattern. The resist surface is subjected to hydrophilic treatment and plating to form the desired metal pattern.

EXAMPLE

Examples of the invention are given below by way of illustration and not by way of limitation.

Synthesis Example 1
Synthesis of Novolac Resin

Under light shielded conditions, 100 g (0.83 mol) of a novolac resin containing m- and p-cresol in a molar ratio of 4/6 and 25 g (0.09 mol) of 1,2-naphthoquinonediazidosulfonyl chloride were dissolved in 500 ml of 1,4-dioxane. Then 10 g (0.09 mol) of triethylamine was added dropwise so that the internal temperature might not exceed 30° C. After the solution was ripened for one hour, it was poured into 5,000 ml of 0.1N aqueous hydrochloric acid. The resulting re-precipitate was filtered, dissolved again in 600 ml of methyl isobutyl ketone, washed with water, and separated. The solvent was removed by vacuum stripping at 40° C. The residue was dissolved again in a mixture of ethyl lactate and butyl acetate, obtaining a naphthoquinonediazidosulfonyl ester-substituted novolac resin having an arbitrary solids level. The novolac resin obtained had an average molecular weight of about 5,000 based on polystyrene standards and the degree of substitution with 1,2-naphthoquinonediazidosulfonyl ester groups was 10.8 mol %.

Example 1

100 parts by weight as solids of the naphthoquinonediazidosulfonyl ester-substituted novolac resin obtained in Synthesis Example 1 was mixed with 12 parts by weight of a hydroxypropyl methyl cellulose phthalate having a carboxybenzoyl group content of 21 to 27 mol % (trade name "HPMCP HP-50" by Shin-Etsu Chemical Co., Ltd., acid value 84). To the mixture were added 2 parts by weight of trihydroxybenzophenyl naphthoquinonesulfonate (trade name NT-300P by Toyo Chemical Synthesis Co., Ltd.) and 0.125 part by weight of a surfactant "X-70-093" (Shin-Etsu Chemical Co., Ltd.). The mixture was stirred and passed through a membrane filter with a pore diameter of 0.2 µm, obtaining a resist composition solution within the scope of the invention.

Using a spinner, the resist composition solution was applied onto a substrate in the form of a 6-inch silicon wafer having gold deposited by sputtering. The coating was prebaked on a hot plate at 120° C. for 300 seconds to form a resist film of 20 µm thick. The resist film was exposed using a g-line stepper (NSR-TFH1, Nikon Corporation; NA=0.22). The resist film was then subjected to puddle development (6 cycles of 50 seconds) with a 2.38% by weight aqueous solution of tetramethylammonium hydroxide. The line-and-space pattern of 4 to 8 µm was observed under SEM (Hitachi Ltd.) to determine the perpendicularity of pattern sidewalls and resolution by the presence or absence of resist residues (scum) in spaces. Separately, after the pattern formation, the substrate was post-baked on a hot plate at 80° C. for 300 seconds, ashing was effected by $O_2$ reactive ion etching (RIE) at 100 W/30 seconds, and gold plating effected at a bath temperature of 70° C. Resistance to the stress of metal growth was evaluated in terms of cracks. The results are shown in Table 1.

Example 2

100 parts by weight as solids of the naphthoquinonediazidosulfonyl ester-substituted novolac resin obtained in Synthesis Example 1 was mixed with 12 parts by weight of a hydroxypropyl methyl cellulose phthalate having a carboxybenzoyl group content of 27 to 35 mol % (trade name "HPMCP HP-55" by Shin-Etsu Chemical Co., Ltd., acid value 123). To the mixture were added 2 parts by weight of trihydroxybenzophenyl naphthoquinonesulfonate (trade name "NT-300P" by Toyo Chemical Synthesis Co., Ltd.) and 0.125 part by weight of a surfactant "X-70-093" (Shin-Etsu Chemical Co., Ltd.). The mixture was stirred and passed through a membrane filter with a pore diameter of 0.2 µm, obtaining a resist composition solution within the scope of the invention.

As in Example 1, the solution was coated onto a gold-sputtered substrate and processed to form a pattern. The pattern perpendicularity, resolution and resistance to metal growth stress were evaluated, with the results shown in Table 1.

Example 3

100 parts by weight as solids of the naphthoquinonediazidosulfonyl ester-substituted novolac resin obtained in Synthesis Example 1 was mixed with 12 parts by weight of a hydroxypropyl methyl cellulose acetate phthalate having a carboxybenzoyl group content of 27 to 35 mol % and an acetyl group content of 30 to 35 mol % (trade name "HPMCAP" by Shin-Etsu Chemical Co., Ltd., acid value 109). To the mixture were added 2 parts by weight of trihydroxybenzophenyl naphthoquinonesulfonate (trade name "NT-300P" by Toyo Chemical Synthesis Co., Ltd.) and 0.125 part by weight of a surfactant "X-70-093" (Shin-Etsu Chemical Co., Ltd.). The mixture was stirred and passed through a membrane filter with a pore diameter of 0.2 µm, obtaining a resist composition solution within the scope of the invention.

As in Example 1, the solution was coated onto a gold-sputtered substrate and processed to form a pattern. The pattern perpendicularity, resolution and resistance to metal growth stress were evaluated, with the results shown in Table 1.

Comparative Example 1

To 100 parts by weight as solids of the naphthoquinonediazidosulfonyl ester-substituted novolac resin obtained in Synthesis Example 1 were added 2 parts by weight of trihydroxybenzophenyl naphthoquinonesulfonate (trade name "NT-300P" by Toyo Chemical Synthesis Co., Ltd.) and 0.125 part by weight of a surfactant "X-70-093" (Shin-Etsu Chemical Co., Ltd.). The mixture was stirred and passed through a membrane filter with a pore diameter of 0.2 µm, obtaining a resist composition solution.

As in Example 1, the solution was coated onto a gold-sputtered substrate and processed to form a pattern. The pattern perpendicularity, resolution and resistance to metal growth stress were evaluated, with the results shown in Table 1.

TABLE 1

|  | Cellulose resin | Pattern sidewall perpendicularity and resolution | Resistance to metal growth stress |
|---|---|---|---|
| Example 1 | HPMCP HP-50 | perpendicular, no scum | no cracks after plating |
| Example 2 | HPMCP HP-55 | perpendicular, no scum | no cracks after plating |
| Example 3 | HPMCAP | perpendicular, no scum | no cracks after plating |
| Comparative Example 1 | none | pattern center slimming, footing, much scum | micro-cracks |

The resist composition of the invention is used in microprocessing as a positive photoresist and offers many advantages including uniformity, high sensitivity, high resolution, good pattern shape, heat resistance, film retention, substrate adhesion, shelf stability, and high throughput of pattern formation. When the formation of a thick film pattern is followed by the formation of a metal pattern by plating, the resist composition exhibits good resistance to metal growth stress. Then the composition is useful as a resist in preparing metal terminals, typically bumps.

Japanese Patent Application No. 2002-228423 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:
1. A positive photoresist composition comprising

(A) a polymer in the form of a novolac resin comprising recurring units of the structure represented by the general formula (1):

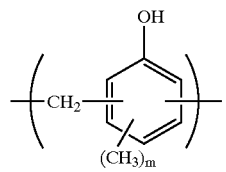

wherein m is an integer of 1 to 3, and having a weight average molecular weight of 1,000 to 30,000 based on polystyrene standards and in which 3 to 27 mol % of the hydroxyl group hydrogens on the novolac resin are substituted with 1,2-naphthoquinonediazidosulfonyl groups, and (B) an alkali-soluble cellulose resin represented by the general formula (2):

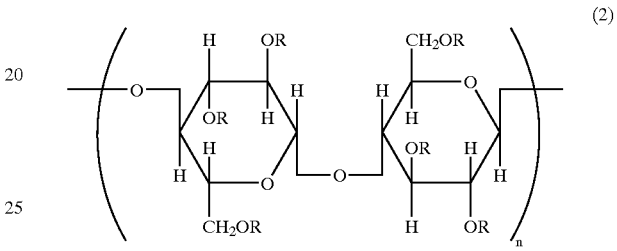

wherein R is independently a hydrogen atom, an alkyl group of 1 to 6 carbon atoms, a hydroxyalkyl group of 1 to 6 carbon atoms, an acyl group of 2 to 15 carbon atoms or an organic group of the structural formula (3):

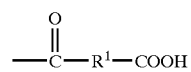

wherein $R^1$ is an alkylene group of 1 to 6 carbon atoms, phenylene group or cyclohexylene group, in a range providing an acid value of 30 to 150, the proportion of the organic group of formula (3) in R being on average 2 to 30 mol % per unit glucose ring, and n is an integer of 2 to 10,000.

2. A positive photoresist composition as in claim 1 which contains 10 to 30 parts by weight of the alkali-soluble cellulose resin (B) per 100 parts by weight of the polymer (A).

* * * * *